(12) United States Patent
Pon

(10) Patent No.: US 6,894,398 B2
(45) Date of Patent: May 17, 2005

(54) INSULATED BOND WIRE ASSEMBLY FOR INTEGRATED CIRCUITS

(75) Inventor: Harry Q. Pon, Carmichael, CA (US)

(73) Assignee: Intel Corporation, Santa Clara, CA (US)

( * ) Notice: Subject to any disclaimer, the term of this patent is extended or adjusted under 35 U.S.C. 154(b) by 71 days.

(21) Appl. No.: 09/822,944

(22) Filed: Mar. 30, 2001

(65) Prior Publication Data

US 2002/0140112 A1 Oct. 3, 2002

(51) Int. Cl.$^7$ .................................................. H01L 23/48
(52) U.S. Cl. ..................... 257/786; 257/723; 257/777; 257/782; 257/784
(58) Field of Search ............................... 257/723, 777, 257/782–786

(56) References Cited

U.S. PATENT DOCUMENTS

| | | | | |
|---|---|---|---|---|
| 5,422,435 A | * | 6/1995 | Takiar et al. | 174/52.2 |
| 5,554,443 A | | 9/1996 | Kondo et al. | |
| 5,798,667 A | * | 8/1998 | Herbert | 327/573 |
| 6,084,295 A | * | 7/2000 | Horiuchi et al. | 257/690 |

FOREIGN PATENT DOCUMENTS

| | | |
|---|---|---|
| EP | 02764940 A2 | 8/1988 |
| GB | 2 300 752 A | 11/1996 |
| JP | 62104127 | 5/1987 |
| JP | 03185742 | 12/1991 |
| JP | 05283461 | 10/1993 |
| JP | 06-295931 A | 10/1994 |
| JP | 11067812 * | 3/1999 |
| WO | WO 98/26452 | 6/1998 |

OTHER PUBLICATIONS

The American Heritage ® Dictionary of the English Language, Third Edition copyright © 1992 by Houghton Mifflin Company. Electronic version licensed from INSO Corporation.*

Harper, Electronic Pakaging and Interconnection Handbook, 1991, McGraHill, 6.60–6.64 and 732–33.*

The American Heritage Dicitonary of Language, Third Edition, 1992, Houghton Mifflin Company.*

Kogyo, Tanaka Denshi KK, Tanaka Information, "Insulation Coated Bonding Wire", Apr. 1996.

*The Temperature Handbook*, "Wire Insulation Identification and Application Guide", Second Edition, Jan. 1, 2000, pp. H2–H58.

PCT/US 02/08904 Search Report mailed Feb. 21, 2003.

* cited by examiner

*Primary Examiner*—Nathan J. Flynn
*Assistant Examiner*—Leonardo Andújar
(74) *Attorney, Agent, or Firm*—Blakely, Sokoloff, Taylor & Zafman LLP

(57) ABSTRACT

An insulated bond wire to connect integrated circuits to each other or to substrates. Insulated bond wires may allow bond wires connecting integrated circuits and substrates to cross without shorting. Because bond wires may be crossed, integrated circuit assemblies with crossing bond wires may not need to be redesigned to avoid the wire crossings. In addition, insulated bond wires may also allow for closer spacing between bond wires due to reduced electronic interference between the wires. Closer spacing may allow for more input and output ports on an integrated circuit and thus increase its functionality.

20 Claims, 5 Drawing Sheets

INSULATED BOND WIRE ASSEMBLY FOR INTEGRATED CIRCUITS

FIELD OF THE INVENTION

The present invention relates to integrated circuits and in particular, insulated bond wires.

BACKGROUND OF THE RELATED ART

Integrated circuit assemblies may use bare bond wires to connect to each other and to underlying substrates. The bare bond wires may connect circuits on integrated circuits to circuits on substrates or other integrated circuits through types of bond pads, such as metal pads and lead frame posts. The bare bond wires may be made of gold, silver, aluminum, or copper.

To install the bare bond wires, a cutting machine may cut ultra thin bare bond wire into predetermined lengths. A bonding machine may then ultrasonically bond each end of the bare bond wire to the bond pad or lead frame post on either an integrated circuit or a substrate. The bond pads may be 100 microns by 100 microns square. The minimum distance the bonding machine can move between the bond pads usually restricts a minimum spacing between the bare bond wires. After making the needed connections with the bare bond wires, hot plastic may be molded over the integrated circuit assembly and cooled.

Using bare bond wires on integrated circuits and substrates has many disadvantages. Because the bare bond wires may short if they come in contact with each other, the integrated circuits are typically designed such that the bare bond wires connecting one integrated circuit to another do not cross each other. A change in design of one integrated circuit or substrate may mean that the other integrated circuits or substrates in the integrated circuit assembly have to be redesigned to keep the bare bond wires from crossing. The redesign of the integrated circuits and substrates may be especially tedious if different vendors manufacture their components.

The bare bond wires that sag may pose additional problems. If the bare bond wires sag into other bare bond wires, the touching bare bond wires may short. In addition, if the bare bond wires sag into an edge of the integrated circuit, the bare bond wires may short as well. The problems with the bare bond wires sagging may become worse if hot plastic is molded over the integrated circuit assembly that uses the bare bond wires. If the hot plastic is molded over the integrated circuit assembly, the hot plastic may push the bare bond wires together, potentially causing them to short. Also, the hot plastic may push the bare bond wires into the edge of the integrated circuit causing the bare bond wires to short.

Another potential problem encountered by the bare bond wires is electronic interference. Current in the bare bond wires may cause electronic interference with the current in neighboring bare bond wires. Accordingly, the bare bond wires may need to be spaced far enough apart to minimize the effects of electronic interference from neighboring bare bond wires.

DETAILED DESCRIPTION OF THE INVENTION

The following description makes reference to numerous specific details in order to provide a thorough understanding of the present invention. However, it is to be noted that not every specific detail need be employed to practice the present invention. Additionally, well-known details, such as particular materials or methods, have not been described in order to avoid obscuring the present invention.

Figure 1:
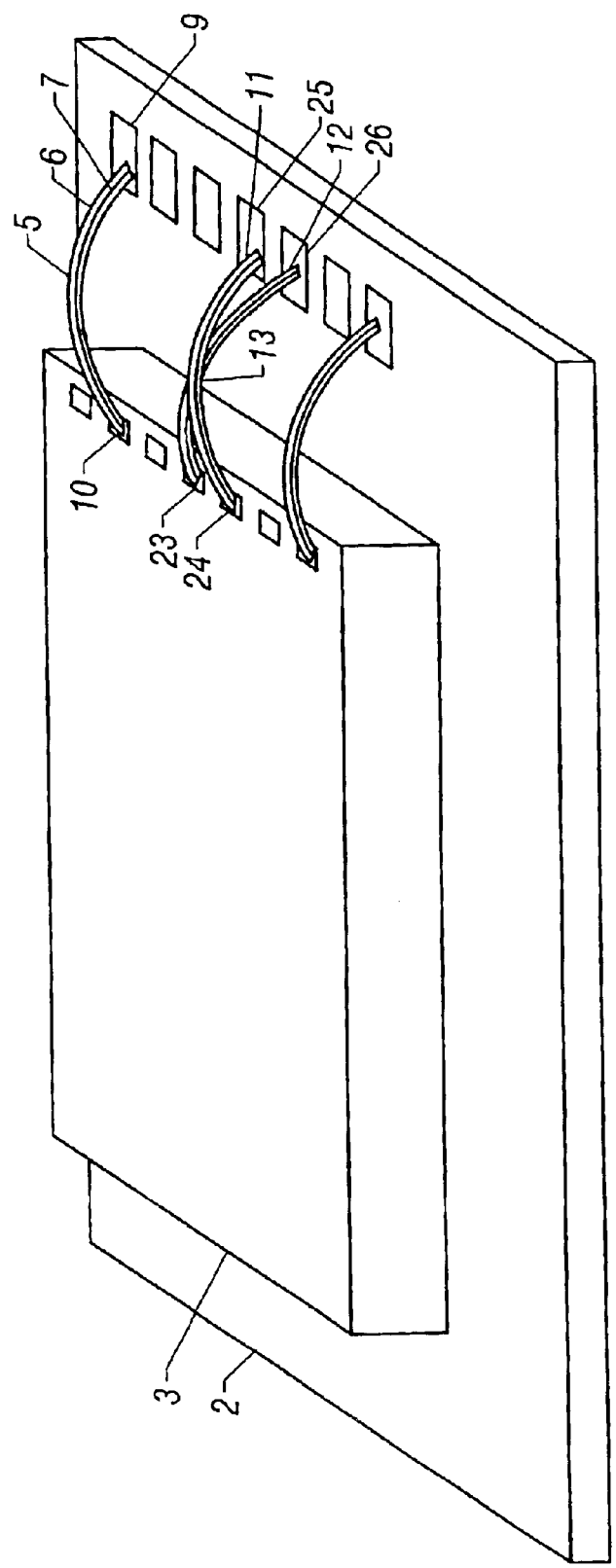
FIG. 1 shows an embodiment of the invention having an integrated circuit connected to a substrate through an insulated bond wire.

Referring to FIG. 1, an embodiment of the invention using insulated bond wires to connect an integrated circuit to an underlying substrate is shown. Bare bond wire materials may be gold, silver, aluminum, or copper. Insulated bond wire 5, having bare bond wire 7 coated in insulating material 6, such as a polymer, may be used to connect the integrated circuit 3 to the underlying substrate 2. Possible insulating materials 6 include, but are not limited to, polyvinyl, polytetrafluoroethylene, fluorinated ethylene propylene, and polyimide. The underlying substrate 2 may also be a second integrated circuit. Examples of the underlying substrates 2 that may be connected to the integrated circuit 3 include, but are not limited to, printable circuit boards, aluminum lead frames, and fine pitch ball grid arrays. To connect the integrated circuit 3 to the underlying substrate 2, a first end of the insulated bond wire 5 may be connected to a lead frame post 9 (a type of bond pad) on the underlying substrate 2, and an end of the insulated bond wire 5 may be connected to the bond pad 10 on the integrated circuit 3. The bond pads 10 on the integrated circuit 3 may be a type of address pin, such as, but not limited to power supply pins, input pins, output pins, input/output pins, control pins, or clock pins. The bond pad 10 and the lead frame post 9 may be made of metal or other materials as known in the art.

As shown in FIG. 1, because at least one of a pair of bond wires 11, 12 is insulated, first bond wire 11 and second bond wire 12 can cross at bond wire crossing 13. The insulating material between the insulated bond wires 11, 12 may prevent current from shorting between one insulated bond wire to the other. If both of the bond wires 11, 12 were not coated in the insulating materials, a short may occur at the bond wire crossing 13 where the bond wires 11, 12 may be touching. The first bond wire 11 may be connected to the integrated circuit 3 and the substrate 2 by a first end connected to bond pad 24 and a second end connected to a bond pad 25. The bond wire 12 may be connected to the integrated circuit 3 and the substrate 2 by a first end connected to bond pad 23 and a second end connected to a bond pad 26. Without insulating material the short may have had to be prevented by redesigning the integrated circuit 3 or the underlying substrate 2. Either the bond pads 23, 24 may have had to be switched or lead frame posts 25, 26 may have had to be switched. The bond wires 11, 12 may allow the integrated circuit 3 and the underlying substrate 2 to be connected without having to be redesigned.

Figure 2:
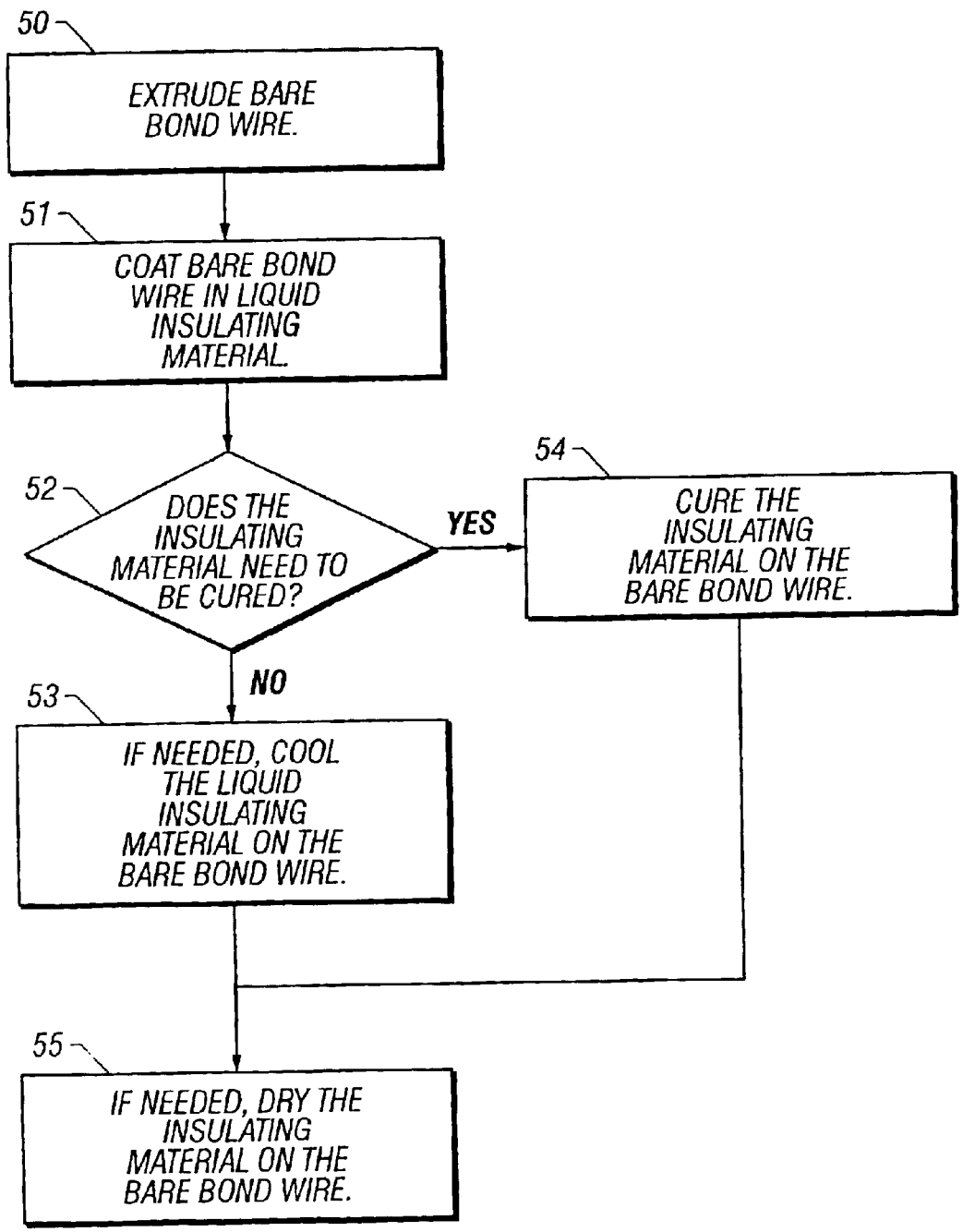
FIG. 2 is a flowchart showing an embodiment of the invention in the form of a method for connecting insulating material to bare bond wire.

Insulating material can be coated onto bare bond wires using several possible methods. FIG. 2 shows a flowchart of one embodiment of a method to coat the insulating material onto the bare bond wire. At block 50, a machine may extrude the bare bond wire using methods known in the art. The bare bond wires may have diameters in the range of approximately 0.5 to 2 mils. However, other bare bond wire diameters may be used. At block 51, liquid insulating material may be coated onto the bare bond wire as the bare bond wire is being extruded or, in another embodiment of the invention, the bare bond wire may be extruded and then dipped or pulled through a bath of the liquid insulating material. At decision block 52, a manufacturer may determine whether to cure or cool the insulating material based on what the insulating material is. For example, if the insulating material is a thermoset polymer, at block 54, the insulating material may be cured on the bare bond wire to form an insulated coating. The insulating material may also be cooled on the bare bond wire at block 53. At block 55, the manufacturer may dry the insulating material, if needed, after the insulating material has been cooled or cured. Other methods of coating the insulating material on the bare bond wire not described herein are also within the scope of the invention.

The thickness of the insulating material connected to the bare bond wires may vary depending on factors such as, but not limited to, the thickness of the bare bond wire and the type of insulating material used. The insulated bond wires in contact after installation on the integrated circuit should have a sufficient thickness of the insulating material connected to them to prevent shorts. For example, if a polymer is used as the insulating material, a thickness in the range of approximately 0.2 micrometers to 0.6 micrometers may be used. However, other insulating material thicknesses may also be used.

Figure 3:
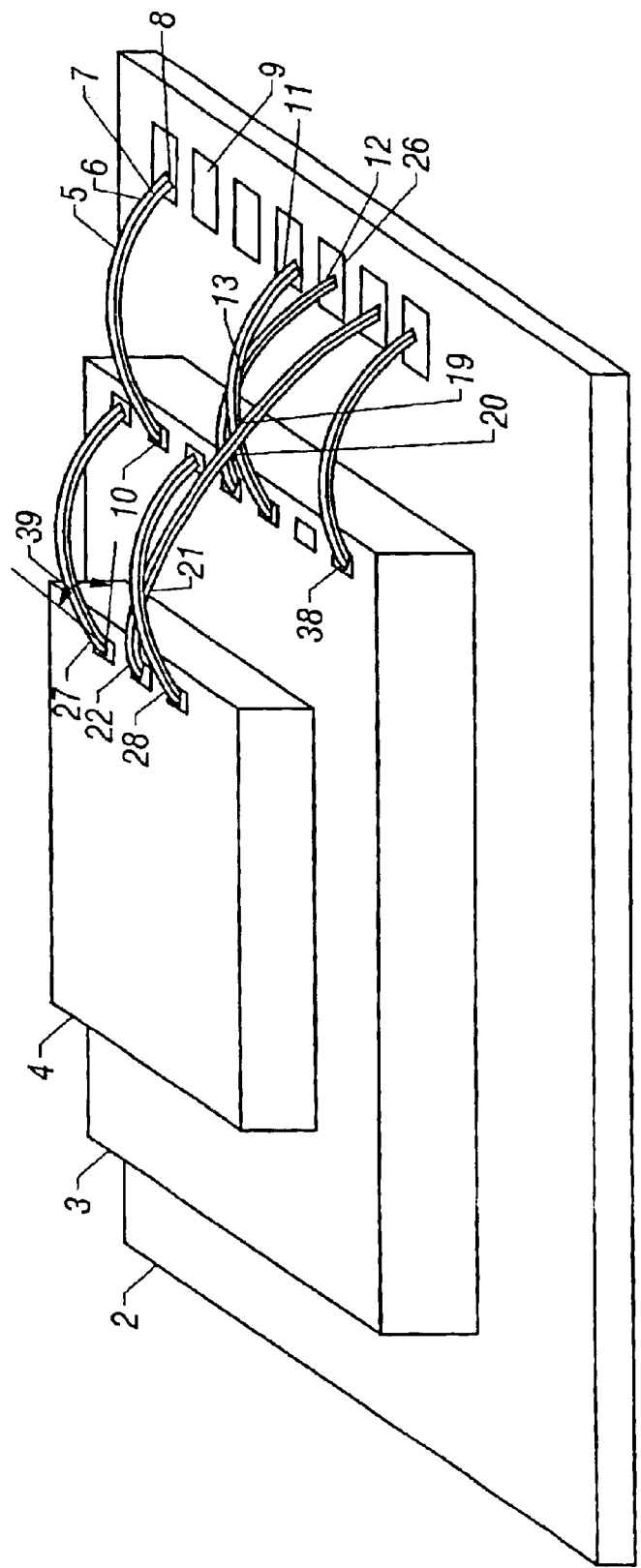
FIG. 3 shows an embodiment of the invention having two integrated circuits connected to each other and to an underlying substrate through multiple insulated bond wires.

Referring to FIG. 3, an embodiment of the invention having multiple integrated circuits connected to an underlying substrate is shown. First integrated circuit 3 may be connected to second integrated circuit 4 through first insulated bond wire 27 and second insulated bond wire 28. Second integrated circuit 4 may also be connected to the underlying substrate 2 by the insulated bond wire 22. The underlying substrate 2 may also be another integrated circuit. With several integrated circuits 3, 4 forming an integrated circuit assembly, the number of potential insulated bond wire crossings may increase. As shown in FIG. 3, the insulated bond wire 22 may cross other insulated bond wires on the integrated circuit assembly at bond wire crossings 19, 20, 21. Also, the insulated bond wire may cross other bond wires that do not have insulating material on them. The insulating material on one of two crossing bond wires should prevent a short between them. If the insulated bond wire 22 did not have insulating material coating it, the integrated circuits 3,4 and the underlying substrate 2 may have had to be redesigned. The bond pads on the integrated circuits and the lead frame posts on the underlying substrate 2 may have needed to be shifted to prevent the bond wire crossings 19, 20, 21. The redesign may have required extensive cooperation between the manufacturers of the integrated circuits 3, 4 and the manufacturers of the underlying substrate 2.

Also, as seen in FIG. 3, if the insulated bond wire 22 sags into an integrated circuit board edge 38, the insulating material coating the bond wire 22 may prevent the bond wire 22 from shorting into the integrated circuit board edge 38. Integrated circuits may be grounded so that the bare bond wire touching the integrated circuit board edge 38 may short. Bond wires may sag on the integrated circuit or if hot plastic is molded onto the integrated circuits 3, 4, the bare bond wire may be pushed into the integrated circuit board edge 38 even if it is not sagging. The insulating material on the insulated bond wires may prevent the bond wire 22 from sagging into or being pushed into the integrated circuit board edge 38 by the hot plastic. The insulating material may need to be made thick enough that the integrated circuit board edge 38 will not be able to cut all the way through the insulating material and make contact with the bond wire 22.

Because insulating material may keep the bond wires from shorting to each other or the integrated circuit board edge 38, bond wire pitch angle 39 may be made smaller. Without the insulating material, the bond wire pitch angles 39 may need to be great enough to prevent the bond wires from contacting other bond wires or the integrated circuit board edge 38. With the insulating material, the insulated bond wires may be able to touch each other and the integrated circuit board edge 38, and therefore, the bond wire pitch angles 39 may be made tighter. Tighter bond wire pitch angles may mean the integrated circuit assembly's final size can be smaller.

Figure 4:
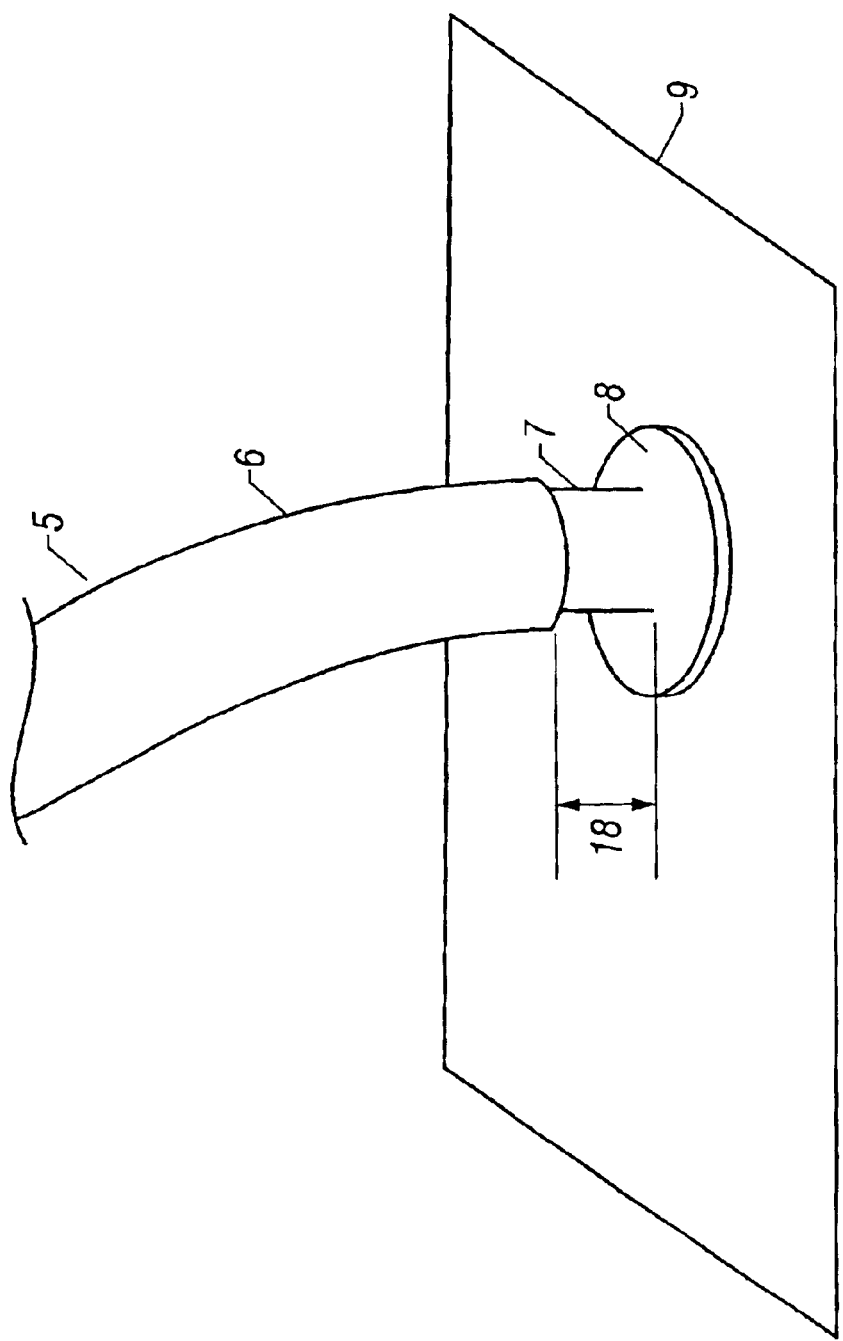
FIG. 4 shows a close-up of a ball bond between an insulated bond wire and a lead frame post.

Referring to FIG. 4, a close-up of a ball bond on an embodiment of the invention is shown. Insulated bond wire 5 is connected to lead frame post 9 through ball bond 8. In one embodiment of the invention, the ball bond 8 may be formed with an ultrasonic bond between an end of insulated bond wire 7 and the lead frame post 9. Insulating material 6 may be removed from the insulated bond wire 7 a distance 18 from the end of the bond wire 7. The insulated bond wire 7 without the insulating material on its ends may bond better to the bond pads or the lead frame posts 9, however, the insulated bond wire 7 may also be connected to the bond pads or the lead frame posts 9 with the insulating material on its ends. The distance 18 may be in the range of approximately 0 to 20 microns or approximately five percent of the bond wire's total length. However, other distances 18 of the insulating material may be removed. In one embodiment of the invention, the insulating material 6 vaporizes off of the end of the bond wire 7 during the ultrasonic bonding process. In another embodiment of the invention, the insulating material 6 is stripped off of the end of the bond wire 7 before the ultrasonic bond is formed. A capillary may be used to cut and strip the end insulating material 6 off. Other methods of stripping the insulating material 6 off of the end of the bond wire 7 are within the scope of the invention. In another embodiment of the invention, a solvent may be applied to the end of the insulated bond wire 5 to dissolve the insulating material 6 off of the end of the bond wire 7.

Figure 5:
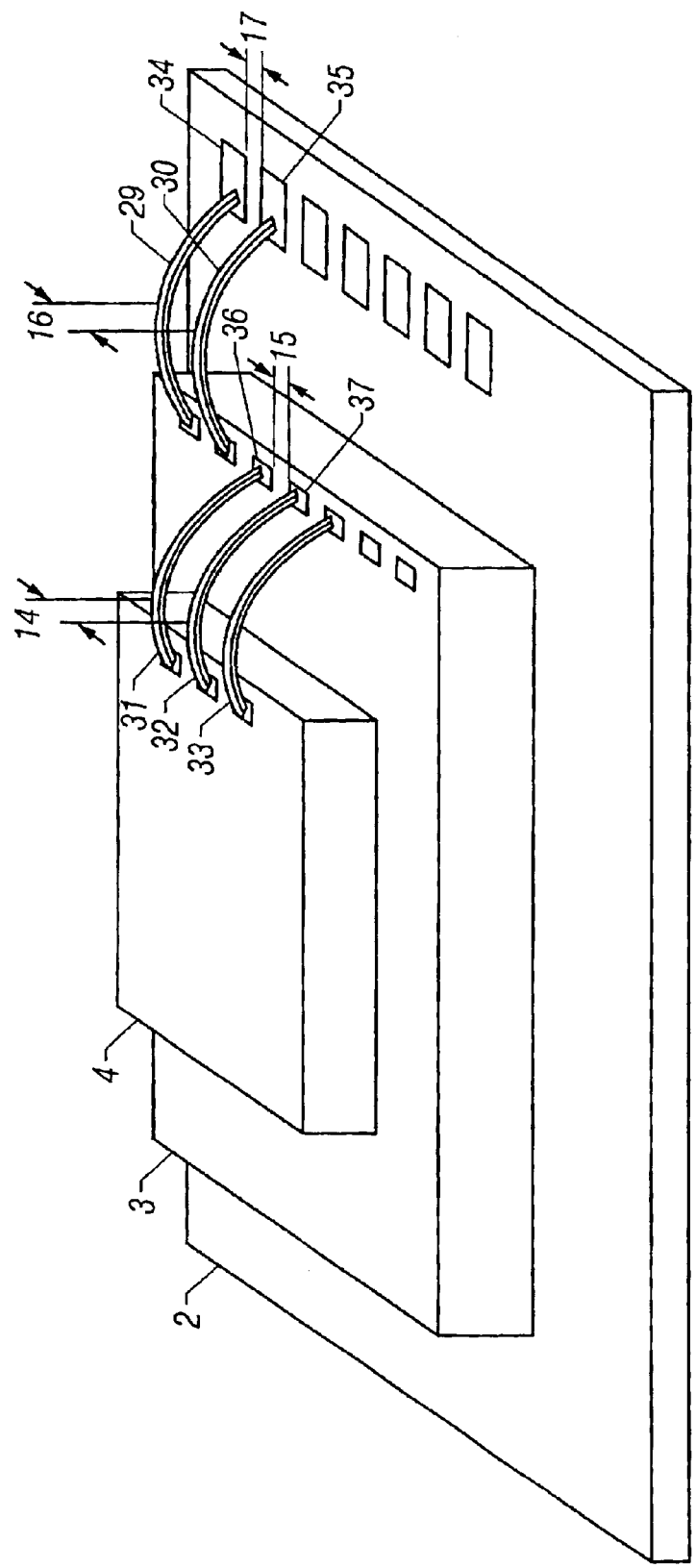
FIG. 5 shows an embodiment of the invention with two integrated circuits connected to each other and an underlying substrate through multiple insulated bond wires placed very close together.

Referring to FIG. 5, an embodiment of the invention having two integrated circuits connected to each other and an underlying substrate 2 through insulated bond wire is shown. If bond wires 29, 30 are coated in an insulating material, such as a polymer, distance 16 between the adjacent insulated bond wires 29, 30 may be smaller than if the bond wires 29, 30 were not coated in the insulating material. The insulating material coating the bond wires 29, 30 may inhibit electronic interference between the bond wires 29, 30 to allow the bond wires 29, 30 to be brought closer together. Because the distance 16 can be decreased, distance 17 between lead frame posts 34, 35 may also be decreased. Because the lead frame posts on the underlying substrate 2 can be brought closer together, the underlying substrate 2 may be capable of holding more lead frame posts and correspondingly have more outlets for input and output. The increased number of the outlets may increase the functionality of the underlying substrate 2. Alternately, the underlying substrate 2 may be made smaller without losing its current level of functionality if it can place the lead frame posts closer together.

In the same way, distance 14 between insulated bond wires 31, 32 may be smaller than if the insulated bond wires 31, 32 were not coated in the insulating material. Because distance 14 can be minimized, distance 15 between bond pads 36, 37 may also be minimized. The reduced space between the bond pads on the integrated circuit 3 means more bond pads may fit on the integrated circuit 3 and thereby increase the functionality of the integrated circuit 3.

Insulated bond wires may increase reliability and flexibility for integrated circuits and integrated circuit designs. Insulated bond wires may cross other insulated bond wires, touch other insulated bond wires, or touch an integrated circuit board edge without shorting. These features of insulated bond wires may allow integrated circuits to attach to each other and other substrates with crossed bond wires where before, the integrated circuits or substrates may have had to be redesigned to prevent crossed wires. Insulated bond wires may also allow for smaller or more functional integrated circuits by allowing insulated bond wires to be closer together without electronically interfering with each other.

Although an exemplary embodiment of the invention has been shown and described in the form of insulated bond wires, many changes, modifications, and substitutions may be made without departing from the spirit and scope of the claimed invention.

I claim:

1. An apparatus comprising:
   a first integrated circuit;
   a second integrated circuit residing on top of the first integrated circuit;
   a first insulated bond wire connecting the first integrated circuit to the second integrated circuit;
   a second insulated bond wire connecting the first integrated circuit to the second integrated circuit, an outer surface of a body of at least one of the first and second insulated bond wires contacting an edge of the second integrated circuit without shorting.

2. The apparatus of claim 1, wherein the first insulated bond wire crosses over the second insulated bond wire.

3. The apparatus of claim 1, wherein a portion of insulation material at an end of the first insulated bond wire is removed when the end of the first insulated bond wire is attached to a bond pad of one of the first and second integrated circuits, and wherein a length of the removed portion is up to approximately 20 microns.

4. The apparatus of claim 3, wherein the first insulated bond wire has a tight bond wire pitch angle.

5. The apparatus of claim 1, wherein insulation of each of the first and second insulated bond wires comprises polymer.

6. The apparatus of claim 1, wherein insulation of each of the first and second insulated bond wires is selected from the group consisting of polyvinyl, polytetrafluoroethylene, fluorinate ethylene propylene, and polyimide.

7. The apparatus of claim 1, wherein each of the first and second insulated bond wires is comprised of a metal selected from the group consisting of gold, silver, aluminum, and copper.

8. The apparatus of claim 1, wherein the first integrated circuit, the second integrated circuit, the first insulated bond wire, and the second insulated bond wire reside within a plastic mold.

9. The apparatus of claim 1, wherein an outer surface of an insulation layer of the first insulated bond wire contacts an outer surface of an insulation layer of the second insulated bond wire.

10. The apparatus of claim 1, wherein the first and second integrated circuits include bond pads, wherein a portion of insulation material at an end of the second insulated bond wire is removed when the end of the second insulated bond wire is attached to one of the bond pads, and wherein length of the removed portion is up to approximately 5 percent of a total length of the second insulated bond wire.

11. The apparatus of claim 1, further comprising:
    a substrate residing at a bottom of the first integrated circuit;
    a third insulated bond wire connecting the first integrated circuit to the substrate; and
    a fourth insulated bond wire connecting the second integrated circuit to the substrate, the fourth insulated bond wire crossing over at least one of the first, second, and third insulated bond wires.

12. An integrated circuit assembly comprising a plurality of stacked integrated circuits electrically coupled by a plurality of bond wires, wherein each bond wire has an insulating material coating the bond wire, and wherein a body of at least one of the bond wires contacts an edge of at least one of the integrated circuits without shorting.

13. The integrated circuit assembly of claim 12, wherein the insulating material has a thickness in a range of approximately 0.2 micrometers to 0.6 micrometers.

14. The integrated circuit assembly of claim 12, wherein the insulating material comprises a polymer.

15. The integrated circuit assembly of claim 12, wherein the plurality of bond wires includes bond wires that cross over each other.

16. The integrated circuit assembly of claim 12, wherein the plurality of bond wires includes bond wires that have insulating material that is thick enough such that the edge of the at least one integrated circuit does not cut into the insulating material of the bond wires.

17. The integrated circuit assembly of claim 12, further comprising a substrate.

18. An apparatus comprising:
    a first integrated circuit;
    a second integrated circuit residing on top of the first integrated circuit;
    an insulated bond wire connecting the first integrated circuit to the second integrated circuit;
    an uninsulated bond wire connecting the first integrated circuit to the second integrated circuit.

19. The apparatus of claim 18, wherein the insulated bond wire crosses over the uninsulated bond wire.

20. The apparatus of claim 18, wherein the uninsulated bond wire touches an outer surface of insulating material of the insulated bond wire.

* * * * *